(12) United States Patent
Galburt et al.

(10) Patent No.: US 7,075,623 B2
(45) Date of Patent: Jul. 11, 2006

(54) FLEXURE-SUPPORTED SPLIT REACTION MASS

(75) Inventors: Daniel N Galburt, Wilton, CT (US); Mark Williams, Amherst, NH (US)

(73) Assignee: ASML Holding N.V., Veldhoven (NL)

( * ) Notice: Subject to any disclaimer, the term of this patent is extended or adjusted under 35 U.S.C. 154(b) by 316 days.

(21) Appl. No.: 10/713,055

(22) Filed: Nov. 17, 2003

(65) Prior Publication Data

US 2005/0103967 A1 May 19, 2005

(51) Int. Cl.
*G03B 27/64* (2006.01)
*G03B 27/58* (2006.01)
*G03B 27/42* (2006.01)

(52) U.S. Cl. .............................. 355/72; 355/75; 355/53; 310/10; 310/12; 318/649

(58) Field of Classification Search .................. 355/53, 355/72, 75; 310/10, 12; 318/649
See application file for complete search history.

(56) References Cited

U.S. PATENT DOCUMENTS

| | | | |
|---|---|---|---|
| 6,597,435 B1 * | 7/2003 | Poon et al. ................... | 355/75 |
| 6,788,386 B1 * | 9/2004 | Cox et al. ..................... | 355/53 |
| 6,794,660 B1 | 9/2004 | Watson | |
| 6,947,125 B1 * | 9/2005 | del Puerto ................... | 355/75 |
| 2002/0093637 A1 * | 7/2002 | Yuan et al. ................... | 355/72 |
| 2004/0160585 A1 * | 8/2004 | Jacobs et al. ................ | 355/53 |

OTHER PUBLICATIONS

Muller, Gerrit, "The Waferstepper Challenge: Innovation and Reliability despite Complexity," Version 1.0, Embedded Systems Institute, May 21, 2003 (12 pages) (*viewed online at* http://www.ict-kenniscongres.nl/sites/ict/contents/i000638/muller.pdf).

* cited by examiner

*Primary Examiner*—Alan Mathews
(74) *Attorney, Agent, or Firm*—Sterne, Kessler, Goldstein & Fox P.L.L.C.

(57) ABSTRACT

An apparatus for stabilizing a scanning system during lithographic processing comprises a baseframe, a reaction mass, and a pair of flexures connecting the reaction mass to the baseframe. The apparatus also comprises a second reaction mass and a second pair of flexures, placed in parallel to the first to form a split reaction mass system. The apparatus is configured such that, upon acceleration of a stage movably coupled to the reaction masses, a resulting load is split substantially evenly between the first and second reaction masses. Also upon acceleration of the stage, the first reaction mass rotates in the opposite direction of the second reaction mass, resulting in a net moment reaction on the baseframe of approximately zero.

20 Claims, 9 Drawing Sheets

FLEXURE-SUPPORTED SPLIT REACTION MASS

BACKGROUND OF THE INVENTION

1. Field of the Invention

This invention relates generally to lithographic processing. More particularly, this invention relates to an improved split reaction mass system for counter-balancing stage movement during lithographic processing.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. During lithography, a wafer is disposed on a wafer stage and held in place by a chuck. The chuck is typically a vacuum or electrostatic chuck capable of securely holding the wafer in place. The wafer is exposed to an image projected onto its surface by exposure optics located within a lithography apparatus. While exposure optics are used in the case of photolithography, a different type of exposure apparatus can be used depending on the particular application. For example, x-ray, ion, electron, or photon lithographies each may require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be stepped between field exposures to allow multiple copies of a reticle pattern to be exposed over the wafer surface. In this manner, the sharpness of the image projected onto the wafer is maximized.

While using a step-and-scan technique generally assists in improving overall image sharpness, image distortions may occur in such systems due to movement of the entire system caused by the acceleration of the reticle stage or wafer stage. One way to correct this is by providing a counter balance (also referred to as a reaction mass) to minimize the movement of the lithographic system upon acceleration of a stage. Typically, counter balance mechanisms are guided by bearings or flexures.

When bearings are used, a number of bearings are needed to guide the reaction mass (e.g., some are needed underneath the reaction mass, some are needed on the sides, etc.). With a split reaction mass stage, where at least two reaction masses are used, many more bearings are needed. Although various types of bearings can be used (e.g., ball bearings, roller bearings, wheels, etc.), gas (or air) bearings are preferred in lithography systems because of good rectilinear motion. The extremely low friction of gas bearings also conserves momentum, minimizing motor size. In addition, transmitted vibration is significantly reduced when using gas bearings because air is used instead of a solid object such as a ball. Potential contaminants, such as the lubricant in a ball or roller bearing are not present with gas bearings. However, gas bearings are not compatible with high vacuum lithography systems for various reasons. Dynamically sealing against gas leakage into the vacuum chamber requires at least two pre-vacuum grooves in each cylindrical air bearing, which in turn demand additional vacuum pumps, resulting in an expensive system. The dynamic nature of the seal can result in some leakage of air bearing gas into the vacuum chamber, which increases the required size of the main vacuum pumps. Potential failure of the seal poses a high risk of catastrophic contamination within a controlled environment.

Flexures in the shape of thin plates may be used to guide the motion of a reaction mass. Typically, one end of a flexure is coupled to a protrusion of a reaction mass and the other end is coupled to another entity, such as a baseframe. In this way, both ends of a flexure are constrained so that the flexure cannot rotate upon movement of the reaction mass. Flexure plates usually include one or more groove-like channels at each end for flexibility in supporting the reaction mass. The channels can be angular, rounded, or of any shape that will allow flexibility in the flexure. Flexures, as opposed to gas bearings, are useful in guiding reaction masses in high vacuum environments because flexures are less expensive and do not pose a contamination risk. Flexures, however, present a variety of problems of their own, as is discussed below.

What is needed is a counter balance system used in conjunction with linear stages that stabilizes a lithographic system during processing, without the deficiencies associated with counter balance systems described above.

BRIEF SUMMARY OF THE INVENTION

An apparatus or system for stabilizing a scanning system during lithographic processing is described, including: a baseframe having a first end and a second end, a reaction mass having a first end with a lower connection protrusion and a second end with an upper connection protrusion, and a pair of flexures including a first flexure and a second flexure. The first flexure has a first end coupled to an upper connection protrusion of the baseframe first end and a second end coupled to the lower connection protrusion of the reaction mass. The second flexure has a first end coupled to the upper connection protrusion of the reaction mass and a second end coupled to a lower connection protrusion of the baseframe.

In a system according to the present invention, the system further includes a second reaction mass and a second pair of flexures. In an embodiment, the second reaction mass is placed in parallel with the first reaction mass. According to another embodiment, the second reaction mass and second pair of flexures are placed in parallel, but rotated 180 degrees with respect to the first reaction mass and first pair of flexures.

In a system according to the present invention, a stage is supported by the first and second reaction masses and is movably coupled to the first and second reaction masses such that when the stage accelerates, a resulting load is split substantially evenly between the first and second reaction masses. In an embodiment, upon acceleration of the stage, the first reaction mass rotates in the opposite direction of the second reaction mass, resulting in a net moment reaction on the baseframe of approximately zero.

In a system according to the present invention, the weight of the stage is X times less than the combined weight of the first and second reaction masses, resulting in the first and second reaction masses moving a distance 1/X the distance of the stage, upon acceleration of the stage.

In a system according to the present invention, the first reaction mass weighs substantially the same as the second reaction mass. In an embodiment, the stage weighs approximately 1/10 the weight of each of the first and second reaction masses.

In a system according to the present invention, each flexure has a length to substantially prevent quadratic effects when a reaction mass begins to rotate in reaction to acceleration of the stage.

In a system according to the present invention, at least one channel is cut into both ends of a flexure for flexibility resulting in a geometry that simulates a hinge bearing. In an embodiment, the channel is rounded to avoid stress concentration.

Further embodiments, features, and advantages of the present invention, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Throughout this specification, words such as upper, lower, top, bottom, etc., are for reference only. Use of these reference words allows the reader to better understand the description with regard to the accompanying drawings.

Newton's Third Law of motion states that for every action, or force, in nature, there is an equal and opposite reaction. In other words, if object X exerts a force on object Y, then object Y also exerts an equal and opposite force on object X. Counter balance systems used in mechanical or electromechanical systems, including lithographic processing systems, work under the same principle.

Figure 1A:
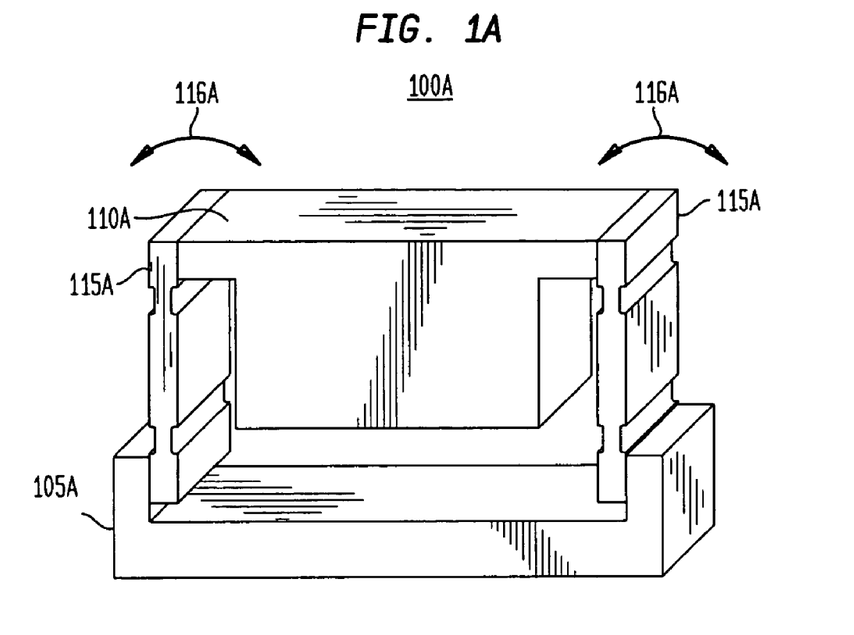
FIG. 1A is an exemplary illustration of a linear spring with flexures that follow a frown-shaped arcuate path upon acceleration of a stage.
Figure 1B:
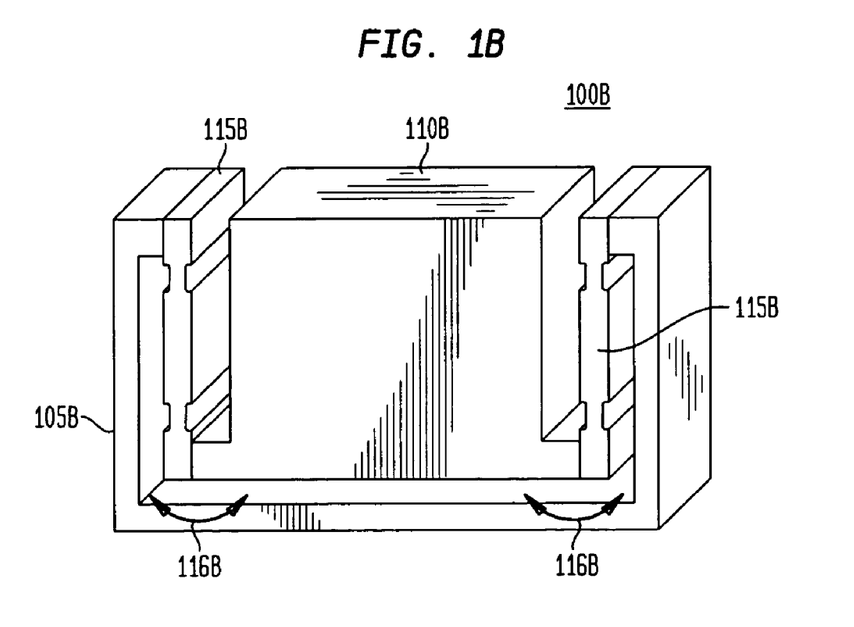
FIG. 1B is an exemplary illustration of a linear spring with flexures that follow a smile-shaped arcuate path upon acceleration of a stage.
Figure 2:
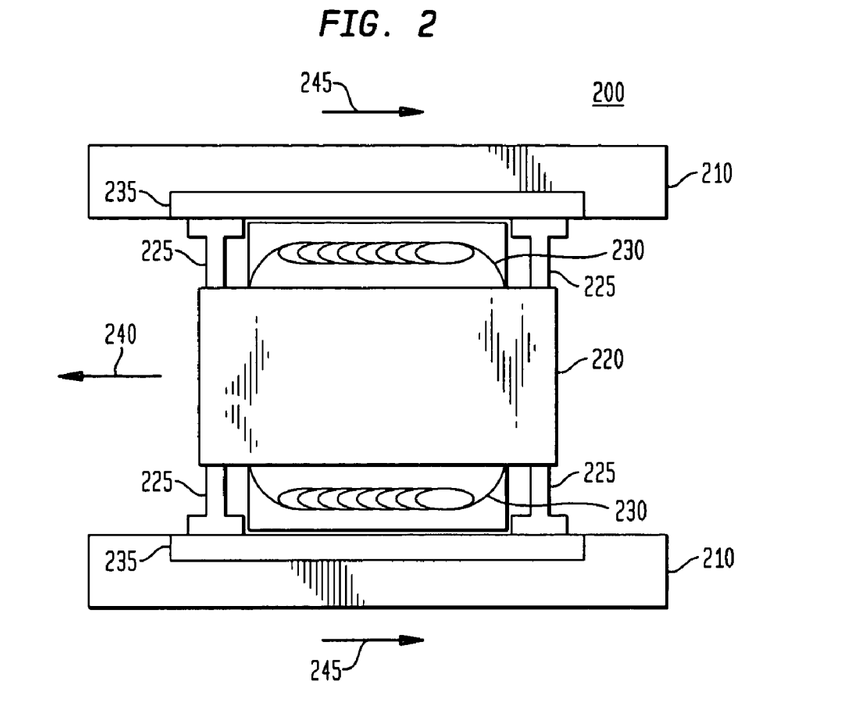
FIG. 2 is an exemplary top-view illustration of a split reaction mass system showing the direction of movement of the reaction masses upon acceleration of a stage.

Conventional reaction masses 110, 210 are illustrated in FIGS. 1A, 1B, and 2. Flexures can be used to guide one or more reaction masses 110, 210 in any lithography environments, including high vacuum environments. It will be appreciated that bearings (or other similarly functioning mechanisms) can be used instead of flexures. A combination of flexures and bearings can also be used. As depicted in linear spring 100A of FIG. 1A, each reaction mass 110A in a system can be supported by two large vertical flexure plates 115A attached at either end of the reaction mass 110A. One end of each flexure 115A is also coupled to a baseframe 105A of the system. In this way, both ends of a flexure are constrained so that the flexure cannot rotate upon movement of the reaction mass. A stage (not shown) is also coupled to the reaction mass 110A such that when the stage accelerates during processing, this movement causes the reaction mass 110A to accelerate in the opposite direction, in an attempt to stabilize the system. This movement is depicted in top-view split reaction mass system 200 of FIG. 2. In a split reaction mass system, typically there are two reaction masses placed in parallel, with a stage located between them. Note that a reaction mass can be of any shape and does not have to be shaped as depicted in the accompanying figures.

In FIG. 2, stage 220 is coupled to reaction masses 210 via bearings 225. In this example, stage 220 is driven via a conventional linear drive motor consisting of linear coils 230 and magnet arrays 235, each magnet array attached to a reaction mass 210. When stage 220 accelerates in direction 240, the reaction masses accelerate in the opposite direction 245 to compensate, eliminating external reaction loads, and thereby stabilizing the system.

The use of flexures presents a variety of problems. Referring again to FIG. 1A, when both flexures 115A are attached to the baseframe 105A at their bottom end and to the reaction mass at their top end, reaction mass 110A follows a frown-shaped arc 116A upon acceleration of a coupled stage (not shown). In other words, the flexures 115A each shorten with a quadratic error. The effect of the quadratic error is an unbalanced up-and-down motion of the reaction mass. Not only could this cause unwanted movements of the system during lithographic processing, but this also may cause a clearance problem between the bouncing reaction mass 110A and a linear motor, if used. Despite the downsides, one advantage of this configuration is that the gravity moments subtract from flexure moments, which reduces or eliminates the re-centering force.

Similarly, as shown in the depiction of linear spring 100B in FIG. 1B, when both flexures 115B are attached to the baseframe 105B at their top end and to reaction mass 110B at their bottom end, reaction mass 110B follows a smile-shaped arc 116B upon acceleration of a coupled stage (not shown). In other words, the flexures 115B each shorten with a quadratic error, and have similar effects as in the prior example. However, when this occurs, gravity moments plus the flexure moments add to produce a stronger re-centering force. The stronger the re-centering force, the larger the load on the reaction masses, therefore requiring larger motors.

Even though linear spring examples 100A and 100B, above, have the advantages of being mechanically compact and able to be designed with very low horizontal stiffness, the disadvantages described above outweigh these advantages. In both examples, the curved motion caused by the quadratic error results in undesirable vertical reaction forces.

As can be seen in the previously-described examples, an action or acceleration by a linear stage in a lithographic processing system may cause various undesirable reactions to those elements directly or indirectly connected to the stage, depending on the configuration used. These undesirable reactions include undesirable movements of the lithographic system, which may degrade or break various mechanical portions of the system over time or may cause diminished quality in lithographic processing.

Figure 3A:
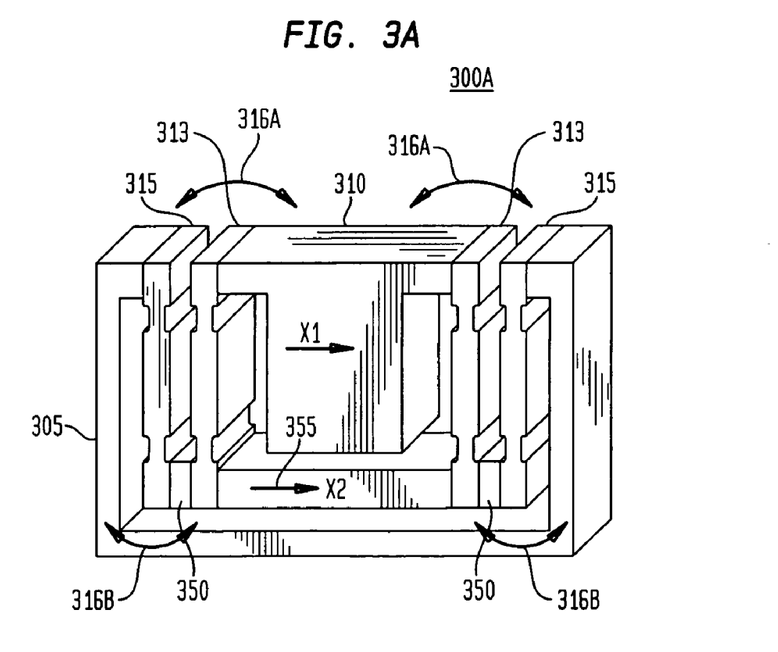
FIG. 3A is an illustration of a compound rectilinear spring, according to an embodiment of the present invention.

A flexure arrangement according to the present invention is illustrated in FIG. 3A. A compound rectilinear spring 300 has a pair of flexure plates 315 supporting an intermediate mass 355 via coupling through flexure connections 350, and another pair of flexure plates 313 folded back to support the reaction mass 310. Upon acceleration of a stage (not shown) coupled to the reaction mass 310, the net effect of this design, assuming the flexure lengths match, is to cause the reaction mass 310 to move in a straight line, while the intermediate mass moves up and down. This arrangement has the advantage of being very resistant to in-the-plane rotation. In addition, the intermediate mass moves one half the distance (×2) of the reaction mass (×1) horizontally, and one quarter the vertical travel of linear springs 100A, 100B. Also, since the intermediate mass is much lighter, its use results in very small disturbance forces on the baseframe. This arrangement, however, tends to reduce the rigidity of the guide system and results in secondary parasitic resonance with intermediate mass 355.

Figure 3B:
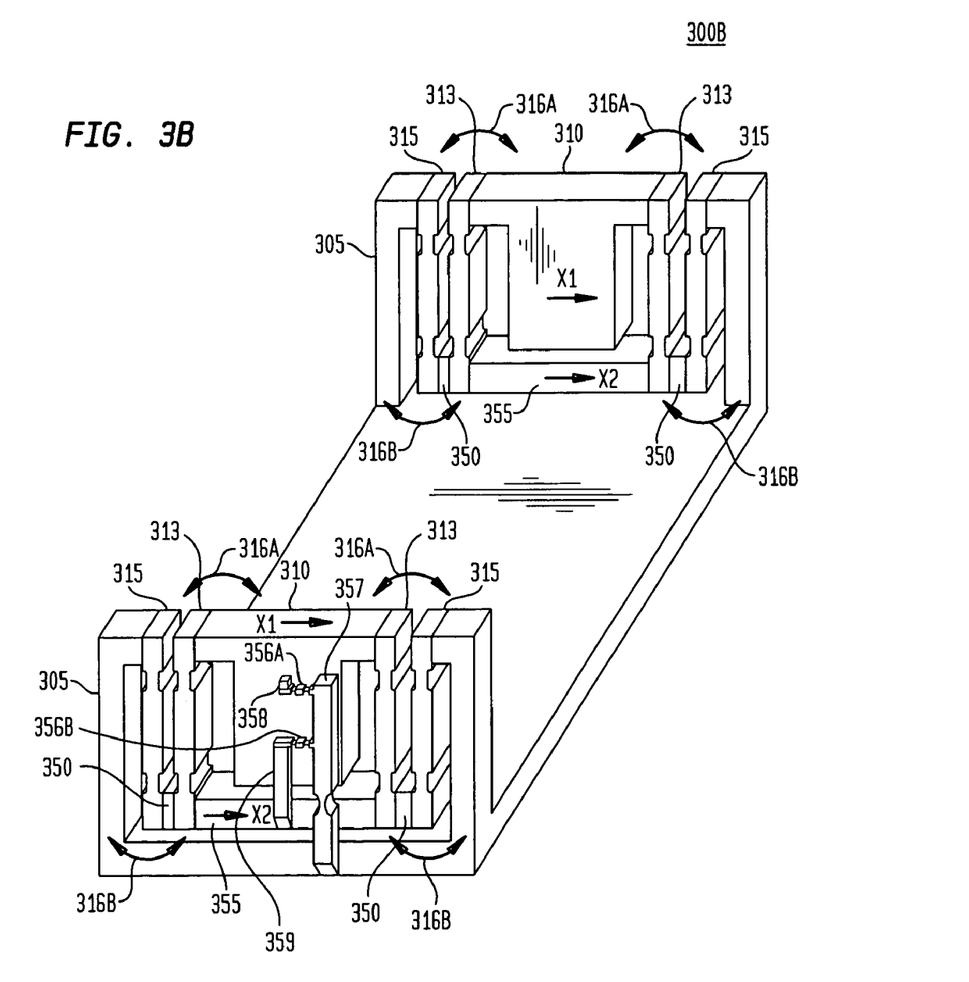
FIG. 3B is an illustration of a double compound rectilinear spring, according to an embodiment of the present invention.

To help alleviate the problem associated with the intermediate mass of FIG. 3A, a lever 357 mounted on baseframe 305 can be used to limit motion of intermediate mass 355 to be half the motion of reaction mass 310, as depicted in FIG. 3B. The lever prevents intermediate mass 355 and its guide flexures from independently shaking in resonant response to reaction mass motion. FIG. 3B depicts a split reaction mass system where a stage (not shown) would be supported between reaction masses 310. The lever 357 is coupled to one end each of two small horizontal flexures 356A/B. The other end of small flexure 356A is coupled to reaction mass support notch 358, which is coupled to reaction mass 310. The other end of small flexure 356B is coupled to intermediate mass support notch 359, which is coupled to intermediate mass 355. The lower end of lever 357 is also flexured near the point that it is attached to baseframe 305. The lever 357 would also be used similarly on the outside of the opposite reaction mass 310. The effect of lever 357 can also be accomplished when intermediate mass 355 is not used by using a lever between reaction mass 310 and the flexures.

Figure 4:
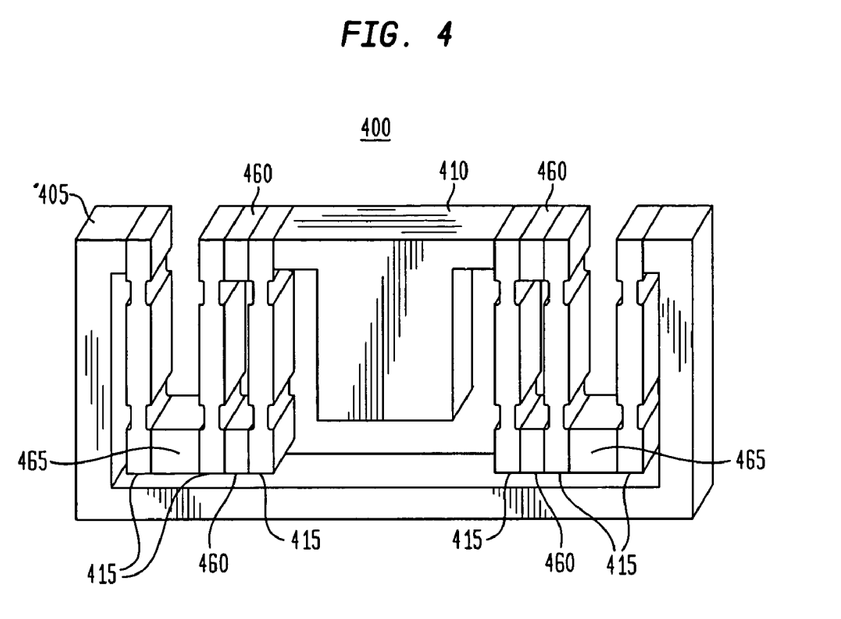
FIG. 4 is an illustration of a modified compound rectilinear spring, according to an embodiment of the present invention.

Another flexure embodiment is illustrated in FIG. 4. Modified compound rectilinear spring 400 has two intermediate masses 465 connecting the baseframe 405 with the reaction mass 410 through the use of six flexures 415 and flexure connections 460. Flexure connections 460 provide a connection between flexures while also allowing the flexures flexibility of movement. Upon acceleration of a stage (not shown) coupled to reaction mass 410, the intermediate masses 465 move one half the distance of reaction mass 410. Although this is more mechanically compact than the non-modified compound rectilinear spring 300A, it is less resistant to in-the-plane rotation.

Figure 5A:
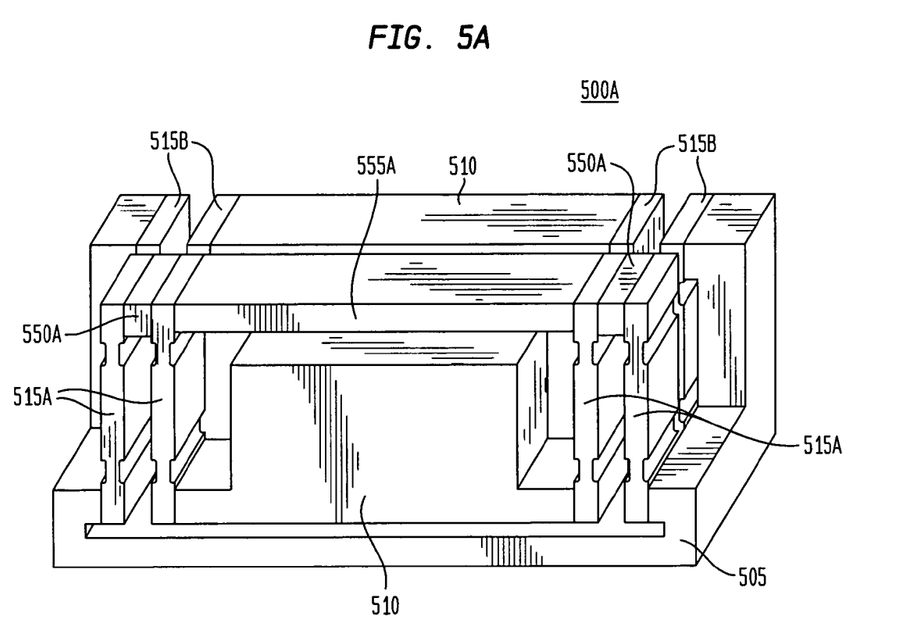
FIGS. 5A and 5B are illustrations of a modified double compound rectilinear spring, according to an embodiment of the present invention.
Figure 5B:
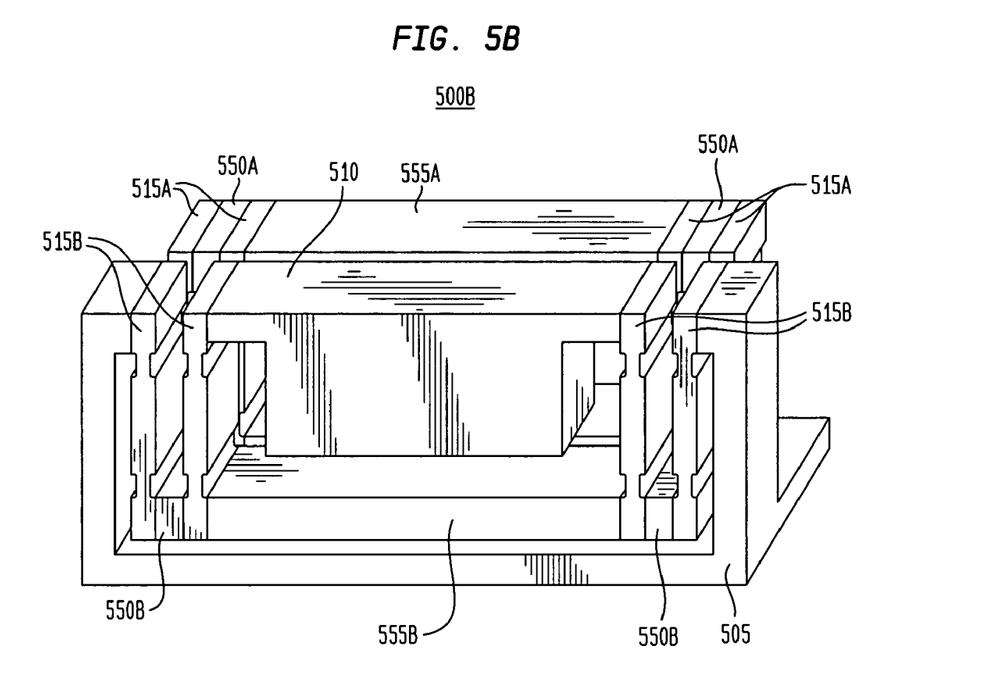

Another flexure embodiment is illustrated in FIGS. 5A/B. FIGS. 5A and 5B each illustrate a differing perspective view of a double modified compound rectilinear spring. FIG. 5A illustrates one view 500A and FIG. 5B illustrates the opposite view 500B. This arrangement includes two intermediate masses 555A and 555B connecting the baseframe 505 with reaction mass 510 through the use of eight flexures (four flexures 515A associated with one intermediate mass 555A, and four flexures 515B associated with one intermediate mass 555B) and flexure connections 550A and 550B. Upon acceleration of a stage (not shown) coupled to reaction mass 510, the displacement of reaction mass 510 is rectilinear, and vertical forces on the baseframe cancel. The two intermediate masses 555A and 555B move one half the distance of reaction mass 510. Due to offset in the flexures, a small moment will exist. However, this moment can be cancelled by reversing the mounting of a second balance mass in a split reaction mass system. Using the split reaction mass system results in zero net force and torque on baseframe 505. However, this system is larger and more difficult to package than the systems previously described.

Figure 6:
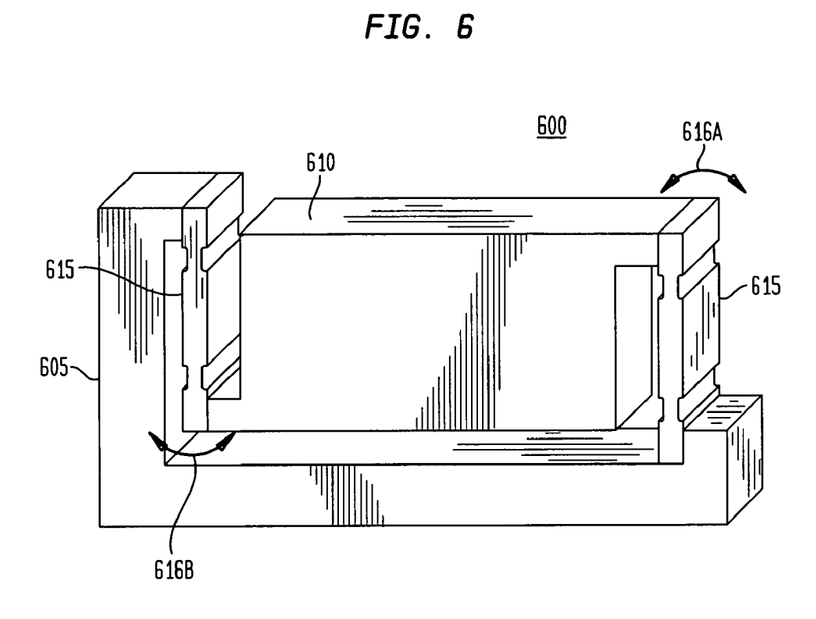
FIG. 6 is an illustration of an opposed linear spring, according to an embodiment of the present invention.

Yet another embodiment of the present invention is depicted in FIG. 6. Opposed linear spring 600 presents a compact single reaction mass solution to correct the quadratic error problem described above. In opposed linear spring 600, baseframe 605 has a first end with an upper protrusion connector and a second end with a lower protrusion connector. Reaction mass 610 has a first end with a lower protrusion connector and a second end with an upper protrusion connector. Reaction mass 610 is coupled to baseframe 605 through the use of flexures 615. The upper protrusion connector of baseframe 605 is coupled to one end of a flexure, and the lower protrusion connector of reaction mass 610 is coupled to the other end of the same flexure. Similarly, the lower protrusion connector of baseframe 605 is coupled to one end of a flexure, and the upper protrusion connector of reaction mass 610 is coupled to the other end of the same flexure. With this arrangement, upon acceleration of a stage (not shown) coupled to the reaction mass 610, the lower protrusion at the first end of reaction mass 610 follows a smile-shaped arc 616B and the upper protrusion at the second end of reaction mass 610 follows a frown-shaped arc 616A. This eliminates the reaction load in the Z-direction (up-and-down) and eliminates any gravity centering effects. In other words, the center of mass of the reaction mass moves in a straight line. However, a rotational error occurs that follows the arcs 616A and 616B.

In another embodiment, two opposed linear springs 600 are used in a split reaction mass system, with the two opposed linear springs 600 similarly placed in parallel. A stage is placed between the reaction masses 610 and is movably coupled to each reaction mass 610. Upon acceleration of the stage, the reaction load is divided between the two reaction masses 610 and the center of mass of each reaction mass will, again, move in a straight line. However, a rotational error will still occur.

Figure 7:
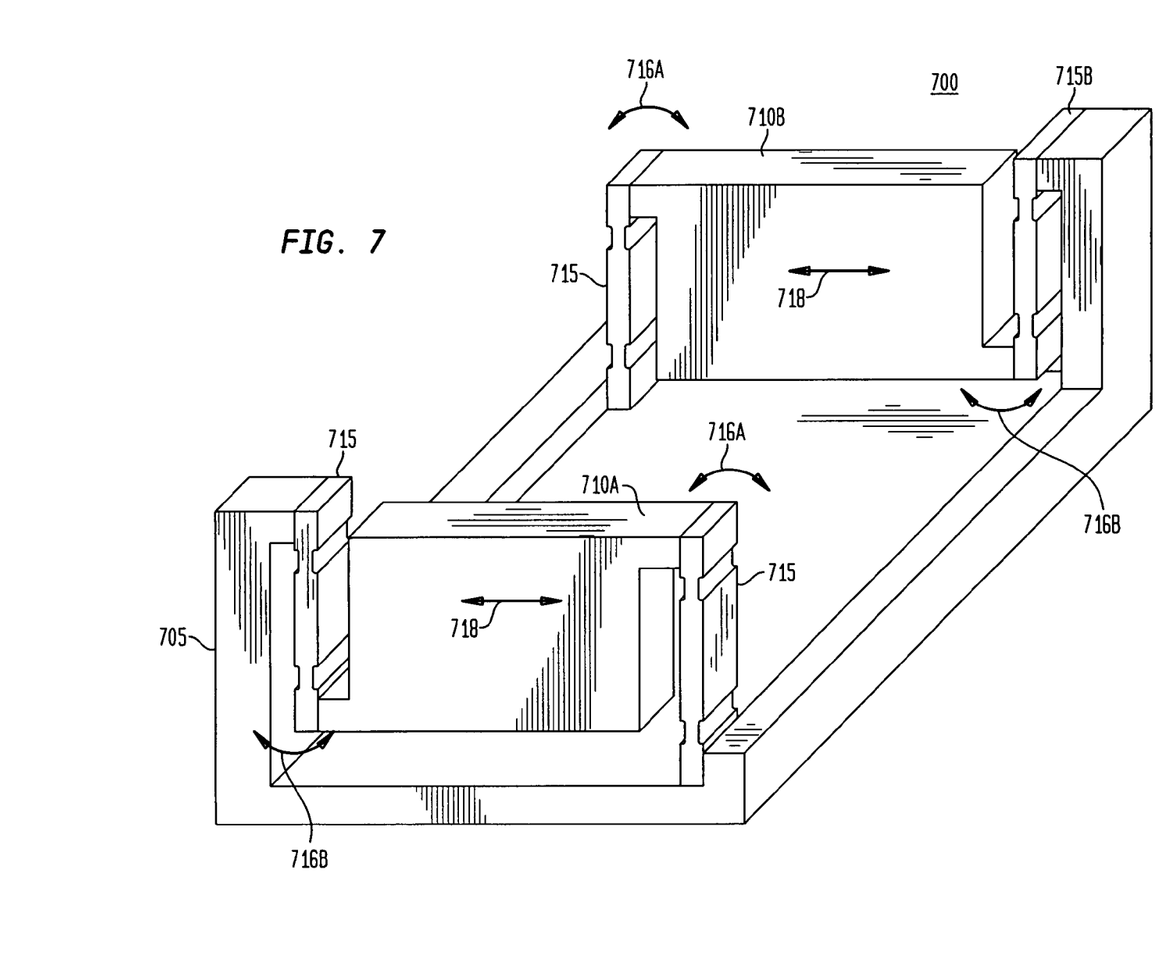
FIG. 7 is an illustration of a double opposed linear spring, according to an embodiment of the present invention.

In order to prevent rotational error, a still further embodiment of the present invention includes using two opposed linear springs 600 in a split reaction mass system with one opposed linear spring placed in parallel with the other, but turned 180 degrees. This arrangement is depicted as double opposed linear spring 700 of FIG. 7. A stage (not shown) is placed between reaction masses 710A and 710B and is movably coupled to each. Upon acceleration of the stage, the reaction load is divided between the two reaction masses 710A/710B and the center of mass of each reaction mass will move in a straight line 718. However, with this arrangement, quadratic error 716A of each reaction mass is canceled by quadratic error 716B of the other reaction mass, thereby eliminating the rotational error as well as the reaction load in the Z-direction (up-and-down) and any gravity centering effects. In other words, one reaction mass 710A will rotate in the opposite direction as the other reaction mass 710B, resulting in a net moment reaction on baseframe 705 of approximately zero. The present invention, therefore, provides a less costly and more reliable reaction mass system, especially for use in high vacuum environments.

Referring again briefly to FIG. 6, according to the laws of physics, when a stage (not shown) movably coupled to reaction mass 610 accelerates and moves a distance in one direction, reaction mass 610, weighing X times more than the stage, moves in the opposite direction a distance 1/X times that of the stage. Referring again to FIG. 7, when a stage (not shown) is movably coupled to two reaction masses 710A/710B in a split reaction mass system 700, the load is divided approximately evenly between the two reaction masses 710A/710B upon acceleration of the stage. In this split reaction mass system 700, if the combined weight of the first reaction mass 710A and second reaction mass 710B weighs $X_1$ times more than the stage, then the first reaction mass 710A and the second reaction mass 710B each move in the opposite direction a distance $1/X_1$ that of the stage, assuming reaction masses 710A/710B are substantially evenly-weighted. A typical lithography system has a drive ratio of about 10 to 1. That is, the total weight of the reaction masses of a system is 10 times greater than the stage. For example, if the stage weighs 50 kg, and the reaction masses weigh a total of 500 kg, then if the stage moves 20 cm, the reaction masses will only move approximately 2 cm.

Figure 8A:
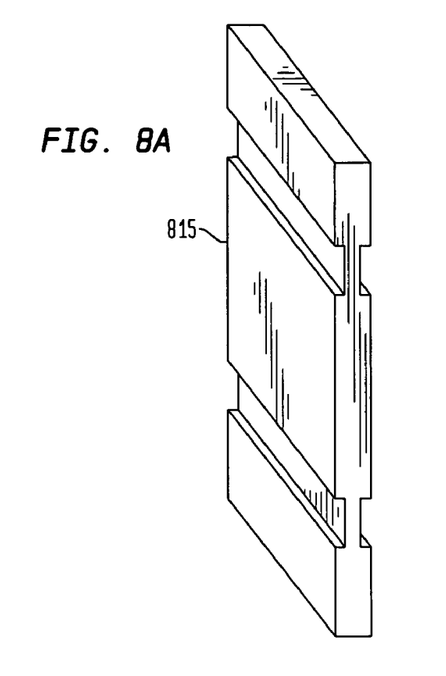
FIGS. 8A–8E are illustrations of an example flexure with channels cut into each end.
Figure 8B:
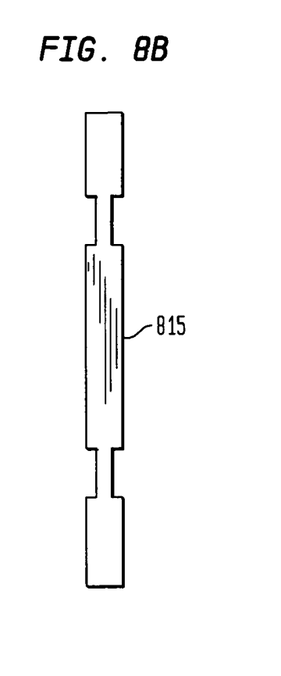
Figure 8C:
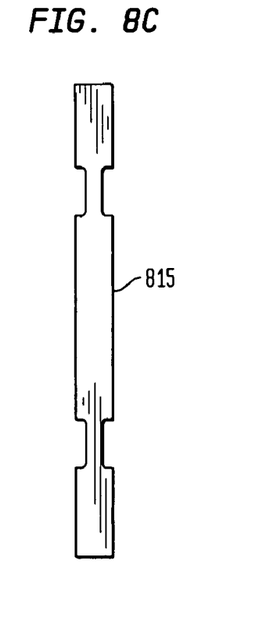
Figure 8D:
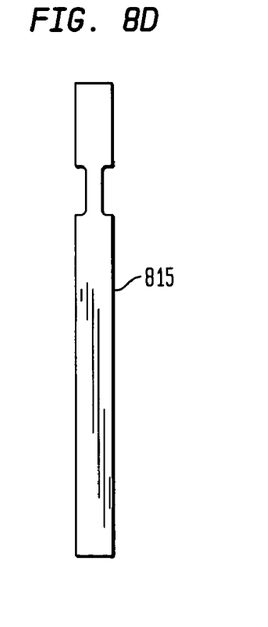
Figure 8E:
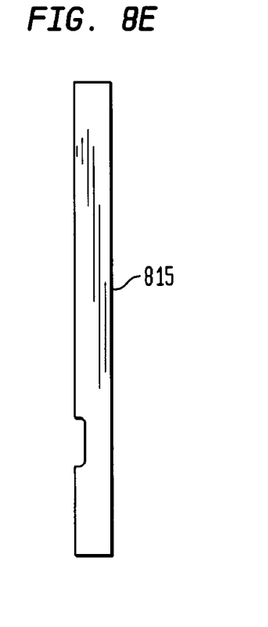

Flexures used with the present invention need to be of a length long enough to prevent quadratic effects when a reaction mass begins to rotate in reaction to the acceleration of a stage. Typically, flexures having a length of approximately 25.4 cm (the equivalent of about 10 inches) are sufficient for this purpose. Ideally, flexure lengths are identical in order to ensure linear movement. Flexures are typically made of metal, including but not limited to aluminum or steel. However, it is appreciated that flexures can be made of other materials found suitable by those skilled in the art(s). In order to improve upon the flexibility of a flexure supporting a reaction mass, groove-like channels are cut into the ends of flexures, as can be seen in example flexure 815 depicted in FIGS. 8A–8E. FIG. 8A shows a three-dimensional view of flexure 815 with channels cut at each end, and FIG. 8B shows a two-dimensional end view of the same flexure 815. FIG. 8D shows an example of flexure 815 with channels cut into only one end. FIG. 8E shows an example of only one channel cut into only one end. A flexure may also have one channel cut into each end. The geometry of the channels creates further flexibility in that the movement of the flexure simulates that of a hinge bearing. The channels can be angular, rounded, or of any shape that will allow flexibility in the flexure. FIG. 8C shows flexure 815 with rounded channels. An advantage of a rounded channel is the avoidance of stress concentration.

CONCLUSION

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. For example, bearings (or other similarly functioning mechanisms) can be used in place of the flexures to accomplish the same desired effect. In addition, flexures and bearings. A combination of flexures and bearings can also be used. Thus, the breadth and scope of the present invention should not be limited by any of the above-described exemplary embodiments, but should be defined only in accordance with the following claims and their equivalents.

What is claimed is:

1. A reaction mass apparatus, comprising:
    a baseframe with a first end having a first connection area and a second end having a second connection area;
    at least one reaction mass with a first end having a first connection area and a second end having a second connection area;
    at least one first bearing mechanism that each connects one of said at least one reaction mass first connection area to said baseframe first connection area; and
    at least one second bearing mechanism that each connects one of said at least one reaction mass second connection area to said baseframe second connection area,
    wherein said baseframe, said at least one reaction mass, said at least one first bearing mechanism, and said at least one second bearing mechanism are arranged such that when a force is applied to said at least one reaction mass causing said at least one reaction mass to move in a direction from said first end toward said second end, a center of mass of said at least one reaction mass moves substantially linearly.

2. The reaction mass apparatus of claim 1, wherein said at least one reaction mass first connection area diagonally opposes said at least one reaction mass second connection area.

3. A reaction mass apparatus, comprising:
    a baseframe with a first end having a first connection area and a second end having a second connection area;
    at least one set of at least one reaction mass with a first end having a first connection area and a second end having a second connection area;
    at least one first bearing mechanism that each connects one of said at least one reaction mass first connection area to said baseframe first connection area; and
    at least one second bearing mechanism that each connects one of said at least one reaction mass second connection area to said baseframe second connection area,
    wherein, within the same set, one of said at least one reaction mass is connected to another of said at least one reaction mass by one of said at least one first bearing mechanism and said at least one second bearing mechanism; and wherein said baseframe, said at least one reaction mass, said at least one first bearing mechanism, and said at least one second bearing mechanism are arranged such that when a force is applied to said at least one reaction mass causing said at least one reaction mass to move in a direction from said first end toward said second end, a center of mass of said at least one reaction mass moves substantially linearly.

4. A reaction mass apparatus, comprising:
a baseframe with a first end having a first connection area and a second end having a second connection area;
at least one reaction mass with a first end having a first connection area and a second end having a second connection area, said at least one reaction mass having a corresponding set of at least one intermediate reaction mass, said at least one intermediate reaction mass with a first end having a first connection area and a second end having a second connection area;
at least one first bearing mechanism that each connects said at least one reaction mass first connection area and said at least one intermediate reaction mass first connection area to said baseframe first connection area; and
at least one second bearing mechanism that each connects said at least one reaction mass second connection area and said at least one intermediate reaction mass second connection area to said baseframe second connection area,
wherein said baseframe, said at least one reaction mass, said set of at least one intermediate reaction mass, said at least one first bearing mechanism, and said at least one second bearing mechanism are arranged such that when a force is applied to said at least one reaction mass causing said at least one reaction mass to move in a direction from said first end toward said second end, a center of mass of said at least one reaction mass moves substantially linearly.

5. A reaction mass apparatus, comprising:
a baseframe, having a first end and a second end;
a reaction mass having a first end with a lower connection protrusion and a second end with an upper connection protrusion;
a first flexure having a first end coupled to an upper connection protrusion of said baseframe first end and a second end coupled to said lower connection protrusion of said reaction mass; and
a second flexure having a first end coupled to said upper connection protrusion of said reaction mass and a second end coupled to a lower connection protrusion of said baseframe.

6. The apparatus of claim 5, further comprising:
a second reaction mass;
a third flexure; and
a fourth flexure,
wherein said third and fourth flexures couple said second reaction mass to said baseframe.

7. The apparatus of claim 6, wherein said first reaction mass and said second reaction mass are aligned in parallel.

8. The apparatus of claim 5, further comprising:
a second reaction mass having a first end with an upper connection protrusion and a second end with a lower connection protrusion;
a third flexure having a first end coupled to said upper connection protrusion of said second reaction mass first end and a second end coupled to a lower connection protrusion of said baseframe; and
a fourth flexure having a first end coupled to an upper connection protrusion of said baseframe and a second end coupled to said lower connection protrusion of said second reaction mass second end.

9. The apparatus of claim 8, wherein said first reaction mass and said second reaction mass are aligned in parallel.

10. The apparatus of claim 9, wherein a stage is supported by said first and second reaction masses and is movably coupled to said first and second reaction masses such that when said stage accelerates, a resulting load is split substantially evenly between said first and second reaction masses.

11. The apparatus of claim 10, wherein said first reaction mass rotates in the opposite direction of said second reaction mass upon acceleration of said stage, resulting in a net moment reaction on said baseframe of approximately zero.

12. The apparatus of claim 10, wherein the weight of said stage is X times less than the combined weight of said first reaction mass and said second reaction mass, resulting in said first and second reaction masses moving a distance 1/X the distance of said stage.

13. The apparatus of claim 10, wherein said first reaction mass weighs substantially the same as said second reaction mass.

14. The apparatus of claim 13, wherein said stage weighs approximately 1/10 the weight of each of said first and second reaction masses.

15. The apparatus of claim 10, wherein each flexure has a length to substantially prevent quadratic effects when said reaction mass begins to rotate in reaction to acceleration of said stage.

16. The apparatus of claim 5, wherein at least one flexure is made of metal.

17. The apparatus of claim 16, wherein at least one flexure is made of aluminum.

18. The apparatus of claim 16, wherein at least one flexure is made of steel.

19. The apparatus of claim 5, wherein at least one channel is cut into each of said first end and said second end of said first and said second flexures for flexibility resulting in a geometry that simulates a hinge bearing.

20. The apparatus of claim 19, wherein said channel is rounded to avoid stress concentration.

* * * * *